United States Patent
Yu et al.

(10) Patent No.: US 9,343,419 B2
(45) Date of Patent: May 17, 2016

(54) BUMP STRUCTURES FOR SEMICONDUCTOR PACKAGE

(71) Applicant: Taiwan Semiconductor Manufacturing Company, Ltd., Hsin-Chu (TW)

(72) Inventors: Chen-Hua Yu, Hsin-Chu (TW); Meng-Liang Lin, Hsin-Chu (TW); Jy-Jie Gau, Hsin-Chu (TW); Cheng-Lin Huang, Hsin-Chu (TW); Jing-Cheng Lin, Hsin-Chu (TW); Kuo-Ching Hsu, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/787,465

(22) Filed: Mar. 6, 2013

(65) Prior Publication Data

US 2014/0167254 A1    Jun. 19, 2014

Related U.S. Application Data

(60) Provisional application No. 61/737,559, filed on Dec. 14, 2012.

(51) Int. Cl.
 *H01L 23/00*    (2006.01)

(52) U.S. Cl.
 CPC .............. *H01L 24/17* (2013.01); *H01L 24/11* (2013.01); *H01L 24/13* (2013.01); *H01L 24/14* (2013.01); *H01L 24/16* (2013.01); *H01L 24/81* (2013.01); *H01L 2224/0401* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05571* (2013.01); *H01L 2224/05611* (2013.01); *H01L 2224/05644* (2013.01); *H01L 2224/05647* (2013.01); *H01L 2224/05655* (2013.01); *H01L 2224/06102* (2013.01); *H01L 2224/1146* (2013.01); *H01L 2224/1147* (2013.01); *H01L 2224/131* (2013.01); *H01L 2224/13005* (2013.01); *H01L 2224/13007* (2013.01); *H01L 2224/13021* (2013.01); *H01L 2224/13082* (2013.01); *H01L 2224/13083* (2013.01); *H01L 2224/13109* (2013.01);

(Continued)

(58) Field of Classification Search
 CPC ................... H01L 23/498; H01L 2021/60022; H01L 2021/60025; H01L 2021/60225; H01L 2021/60247; H01L 24/10; H01L 24/01; H01L 23/49811

See application file for complete search history.

(56) References Cited

U.S. PATENT DOCUMENTS 5,986,348 A * 11/1999 Fukano .................... 257/780
6,462,420 B2 * 10/2002 Hikita et al. .............. 257/777

(Continued)

FOREIGN PATENT DOCUMENTS

CN    101345198 A    1/2009

*Primary Examiner* — Peniel M Gumedzoe
(74) *Attorney, Agent, or Firm* — Slater & Matsil, L.L.P.

(57) ABSTRACT

A package structure includes a first substrate bonded to a second substrate by connecting metal pillars on the first substrate to connectors on the second substrate. A first metal pillar is formed overlying and electrically connected to a metal pad on a first region of the first substrate, and a second metal pillar is formed overlying a passivation layer in a second region of the first substrate. A first solder joint region is formed between metal pillar and the first connector, and a second solder joint region is formed between the second metal pillar and the second connector. The lateral dimension of the first metal pillar is greater than the lateral dimension of the second metal pillar.

13 Claims, 11 Drawing Sheets

(52) U.S. Cl.
CPC .......... *H01L 2224/13111* (2013.01); *H01L 2224/13139* (2013.01); *H01L 2224/13144* (2013.01); *H01L 2224/13147* (2013.01); *H01L 2224/13164* (2013.01); *H01L 2224/1403* (2013.01); *H01L 2224/14132* (2013.01); *H01L 2224/16058* (2013.01); *H01L 2224/16111* (2013.01); *H01L 2224/16147* (2013.01); *H01L 2224/16225* (2013.01); *H01L 2224/16227* (2013.01); *H01L 2224/1703* (2013.01); *H01L 2224/17051* (2013.01); *H01L 2224/17517* (2013.01); *H01L 2224/81193* (2013.01); *H01L 2224/81815* (2013.01); *H01L 2224/94* (2013.01); *H01L 2924/1305* (2013.01); *H01L 2924/13091* (2013.01)

(56) References Cited

U.S. PATENT DOCUMENTS

| | | | |
|---|---|---|---|
| 7,215,026 B2* | 5/2007 | Park et al. | 257/737 |
| 7,569,935 B1* | 8/2009 | Fan | 257/737 |
| 2004/0222521 A1* | 11/2004 | Hikita et al. | 257/737 |
| 2004/0266160 A1* | 12/2004 | Jao et al. | 438/613 |
| 2005/0253264 A1* | 11/2005 | Aiba et al. | 257/738 |
| 2009/0146303 A1* | 6/2009 | Kwon | 257/741 |
| 2011/0095418 A1* | 4/2011 | Lim et al. | 257/737 |
| 2012/0012985 A1* | 1/2012 | Shen et al. | 257/618 |
| 2012/0018877 A1* | 1/2012 | Yang et al. | 257/737 |
| 2012/0153433 A1* | 6/2012 | Yen et al. | 257/531 |
| 2012/0193789 A1 | 8/2012 | Hu et al. | |
| 2012/0286418 A1* | 11/2012 | Lee et al. | 257/737 |
| 2012/0313236 A1* | 12/2012 | Wakiyama et al. | 257/734 |
| 2013/0087925 A1* | 4/2013 | Tsai et al. | 257/774 |
| 2013/0119527 A1* | 5/2013 | Luo | H01L 23/36 257/690 |
| 2013/0127048 A1* | 5/2013 | Hasegawa et al. | 257/737 |
| 2013/0134582 A1* | 5/2013 | Yu et al. | 257/737 |
| 2013/0175687 A1* | 7/2013 | Hu | 257/738 |
| 2013/0193593 A1* | 8/2013 | Lin et al. | 257/E23.068 |
| 2013/0264698 A1* | 10/2013 | Travis et al. | 257/692 |
| 2014/0061897 A1* | 3/2014 | Lin et al. | 257/737 |

* cited by examiner

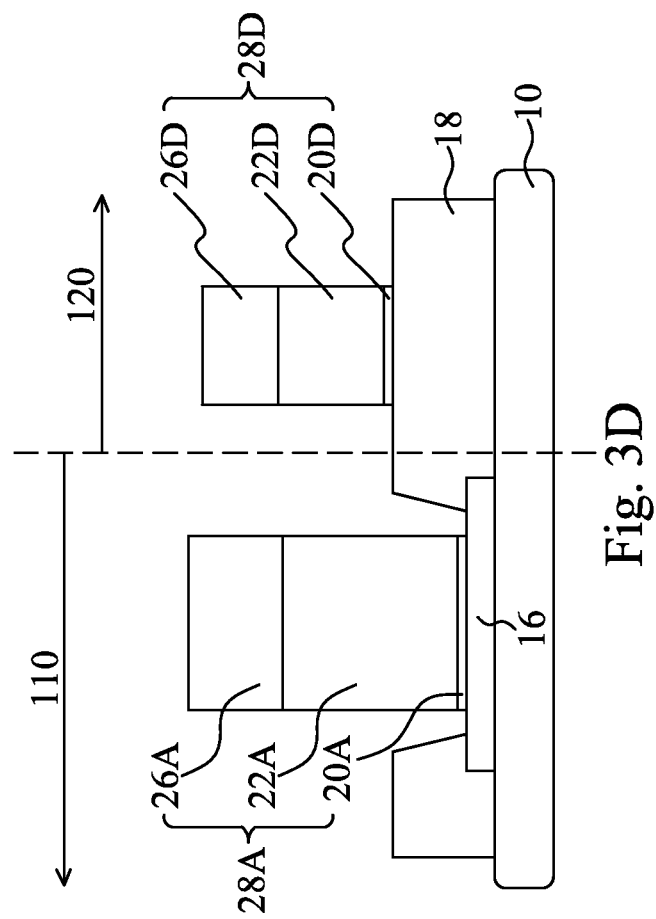

BUMP STRUCTURES FOR SEMICONDUCTOR PACKAGE

This application claims priority to U.S. Provisional Application Ser. No. 61/737,559, filed on Dec. 14, 2012, entitled "Bump Structures for Semiconductor Package," which application is hereby incorporated herein by reference.

BACKGROUND

Semiconductor packaging utilizes bumps to establish electrical contact between a chip's Input/Output (I/O) pads and a substrate. Structurally, a bump structure contains a bump and a so-called under bump metallurgy (UBM) located between the bump and an I/O pad. The bumps themselves, based on the material and shape, are classified as solder balls, pillar bumps and metal bumps with mixed metals. Recently, instead of using solder balls, pillar bumps are used in the electronic component to achieve finer pitch with minimum probability of bump bridging, and to reduce capacitance load for the circuits and allow the electronic component to perform at higher frequencies. A solder alloy is still necessary for capping the bump structure and joining electronic components as well. Properly applied, pillar bumps can be placed in virtually any position on a chip, given the pitch considerations. In addition, redundant bumps can be added for symmetry, mechanical stability, additional thermal arrangement, or to optimize interconnect to reduce inductance and enhance speed.

DESCRIPTION OF THE DRAWINGS

FIGS. 3A through 3E are cross-sectional views of intermediate stages in the manufacturing of bump structures in accordance with an embodiment.

DETAILED DESCRIPTION

Figure 1:
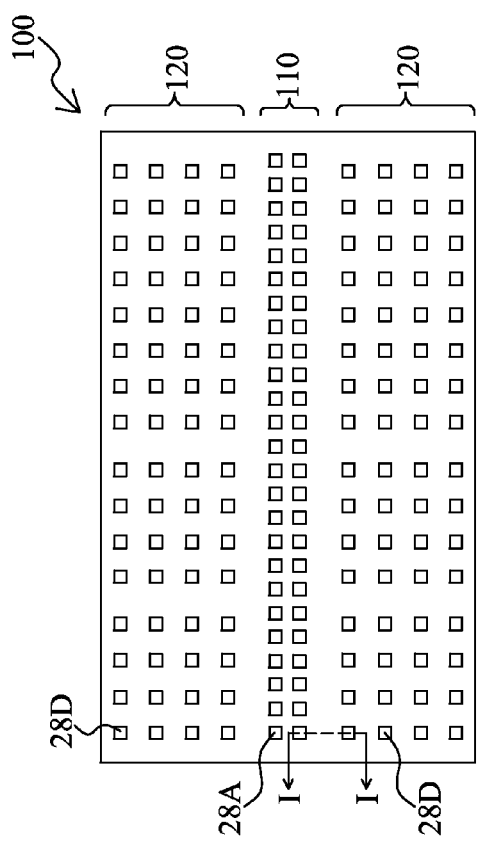
FIG. 1 is a plan view of a semiconductor chip having a plurality of bump structures in accordance with some embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

Figure 2:
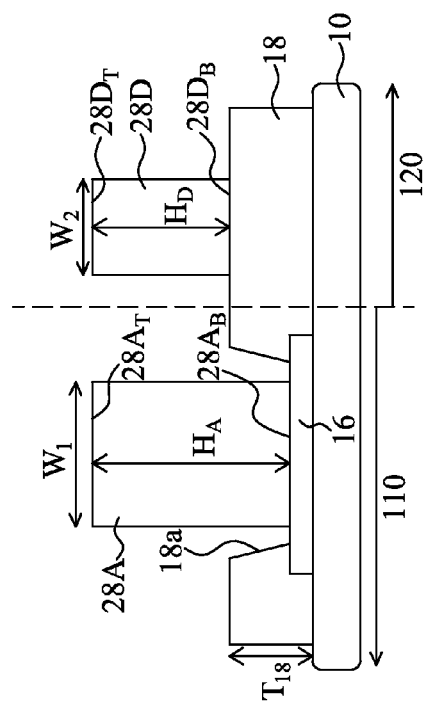
FIG. 2 is a cross-sectional view of the bump structures on the semiconductor chip taken along the line I-I of FIG. 1 in accordance with some embodiments.

FIG. 1 is a plan view of a semiconductor chip having a plurality of bump structures in accordance with some embodiments. FIG. 2 is a cross-sectional view of the bump structures on the semiconductor chip taken along the line I-I of FIG. 1 in accordance with some embodiments.

As depicted in FIG. 1, a semiconductor chip 100 includes at least a first region 110 and a second region 120, wherein a plurality of first bump structures 28A are formed on the first region 110, and a plurality of second bump structures 28D are formed on the second region 120. In an embodiment, the first region 110 is in the central region of the chip 100, and the second region 120 is along the peripheral region of the chip 100. In some embodiments, the first bump structures 28A and the second bump structures 28D are pillar bump structures. In an embodiment, the plan-view profile of the bump structures 28A or 28D is square, and the plan-view profile of the bump structure 28A or 28D can be circular, rectangular, oval, octagonal, or the like according to some embodiments. The first bump structures 28A present a first bump density in the first region 110, and the second bump structures 28D present a second bump density in the second region 120. In an embodiment, the first bump density is different than the second bump density, while the first bump density can be the same as the second bump density in some embodiments. In some embodiments, as depicted in FIG. 1, the first region 110 is smaller than the second region 120, and the first bump density is greater than the second bump density. As examples of the semiconductor chip 100, a logic chip or a memory chip is employed. In an embodiment, the first region 110 is an active region on which the first bump structures 28A function as active bumps, for example signal bumps, and the second region 120 is a dummy region on which the second bump structures 28D represent as dummy bumps without serving electrical connection between the chip 100 and any other substrate.

Referring to FIG. 2, the semiconductor chip 100 includes a first substrate 10, a metal pad 16 on the first substrate 10, and a passivation layer 18 overlying the first substrate 10 and the metal pad 16. The semiconductor chip 100 also includes the first bump structure 28A on the first region 110 and the second bump structure 28D on the second region 120. The first bump structure 28A is electrically connected to the metal pad 16 through an opening 18a in the passivation layer 18, and the second bump structures 28D is positioned on the passivation layer 18 without electrical connecting to the metal pad 16. In some embodiments, the first substrate 10 includes a semiconductor substrate, an integrated circuit device in and/or on the semiconductor substrate, and an interconnect structure overlying the device and the semiconductor substrate. The first substrate 10 is employed in a semiconductor integrated circuit fabrication, and integrated circuits may be formed therein and/or thereupon. The integrated circuit device formed in and/or on the semiconductor substrate may include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, and other suitable elements. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices. The interconnect structure includes inter-layer dielectric layers and metallization layers overlying the integrated circuit device. The inter-layer dielectric layers include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. The metallization layers may be formed of, for example copper (Cu), aluminum (Al), AlCu, copper alloy, or other mobile conductive materials.

The metal pad 16 is a metallization layer formed on the first substrate 10. In an embodiment, the metal pad 16 is formed in the first region 110 of the semiconductor chip 100. In some embodiments, the metal pads 16 can be formed on the first region 110 and the second region 120 as well. Suitable materials for the metal pad 16 may include, but are not limited to, for example Cu, Al, AlCu, copper alloy, or other mobile conductive materials. The metal pad 16 provides an electrical connection upon which the first bump structures 28A are formed for external connections in subsequent processing steps.

The passivation layer 18 is formed on the first substrate 10 and covers some portions of the metal pad 16, while some portions of the metal pad 16 are exposed by the opening 18a in the passivation layer 18. In some embodiments, the passivation layer 18 includes a dielectric layer, a polymer layer, or combinations thereof. The passivation layer 18 may be a single layer or a laminated layer, and the passivation layer 18 may have a single opening or a plurality of openings on one metal pad 16. In FIG. 2, a single layer of the passivation layer 18 having single opening 18a is shown for illustrative purposes only. As such, other embodiments may include any number of passivation layers formed of any number of openings over one metal pad.

The bump structures 28A and 28D are formed after the formation of the passivation layer 18. In some embodiments, the first bump structures 28A are formed on the exposed portions of the metal pad 16 within the first region 110, and the second bump structures 28D are formed on the passivation layer 18 within the second region 120. In at least one embodiment, the bump structures 28A and 28D are formed of pillar bumps. The pillar bumps are formed of conductive materials. In some embodiments, the pillar bump includes an under-bump metallization (UBM) layer, a metal pillar and at least one capping layer. The metal pillar may include copper (Cu), Cu alloy, gold (Au), Au alloy or the like. The capping layer may include nickel (Ni), solder, Au, palladium (Pd), or any other noble metals.

On the first region 110, the first bump structure 28A has a first lateral dimension $W_1$ (also referring to diameter or width of the first bump structure). On the second region 120, the second bump structure 28D has a second lateral dimension $W_2$ (also referring to diameter or width of the second bump structure). In an embodiment, the first lateral dimensions $W_1$ of the first bump structures 28A is uniform throughout the first region 110, and the second lateral dimensions $W_2$ of the second bump structures 28D is uniform throughout the second region 120. In some embodiments, $W_1$ is between about 20 μm and about 30 μm, or between about 20 μm and about 15 μm. In some embodiments, $W_2$ is between about 20 μm and about 30 μm, or between about 20 μm and about 15 μm. In an embodiment, the first lateral dimension $W_1$ is different than the second lateral dimension $W_2$. For example, the difference between $W_1$ and $W_2$ is between about 1 μm and about 10 μm. The first lateral dimension $W_1$ is greater than the second lateral dimension $W_2$ in accordance with some embodiments. For example, $0.84 \leq W_2/W_1 < 1$, or $0 < W_2/W_1 \leq 0.84$, or $W_1 - W_2 \leq 5$ μm. In addition, the first bump structure 28A has a first bump height $H_A$ that is measured from the bottom side 28$A_B$ of the first bump structure 28A to the top side 28$A_T$ of the first bump structure 28A. Similarly, the second bump structure 28D has a second bump height $H_D$ that is measured from the bottom side 28$D_B$ of the second bump structure 28D to the top side 28$D_T$ of the second bump structure 28D. The second bump structures 28D are positioned on the passivation layer 18 with a thickness $T_{18}$. In some embodiments, the thickness $T_{18}$ is greater than about 3 μm. For example the thickness $T_{18}$ is between about 5 μm and about 20 μm. In some embodiments, the first bump height $H_A$ is greater than or equal to the second bump height $H_D$. In an embodiment, $H_A > H_D$, and $0 < W_2/W_1 \leq 0.84$. In an embodiment, $H_A = H_D$, and $0.84 \leq W_2/W_1 \leq 1$.

For reducing or eliminating the gap between the top sides of the two bump structures, the bump heights $H_A$ and $H_D$ are well controlled to make the top side 28$A_t$ of the first bump structure 28A being substantially leveled with the top side 28$D_t$ of the second bump structure 28D according to some embodiments. For example, the gap between the top side 28$A_T$ and the top side 28$D_T$ can be controlled at a range of about 0 to about 5 μm, at a range of about 0 to about 3 μm or at a range of about 0 to about 1 μm. The minimized gap between the top side 28$A_T$ and the top side 28$D_T$ makes control of standoff possible for a package structure with the chip 100 bonded to another substrate. The exemplary package structure involves the chip on a package substrate with bump structures, the chip on a wafer with bump structures, or the chip on another chip with bump structures. By adjusting lateral dimensions $W_1$ and $W_2$ of the bump structures 28A and 28D within the chip 100, the deposition rate effect of the bump structure can control the co-planarity of the bump height distribution, such that variation of standoffs between the chip 100 and the other substrate can be minimized or become more uniform, and quality of dispensing underfill in the package structure is improved. This can reduce assembly risk raised by bump bridging and cold joint issues. In some embodiments, the mechanisms for providing coplanar bump structures can be applied to the manufacture of bump structures with different critical dimension on different regions within the chip.

FIGS. 3A through 3E are cross-sectional views of intermediate stages in the manufacturing of bump structures in accordance with an embodiment. Unless specified otherwise, the reference numerals in these embodiments represent like elements in the embodiments illustrated in FIGS. 1-2.

Figure 3A:
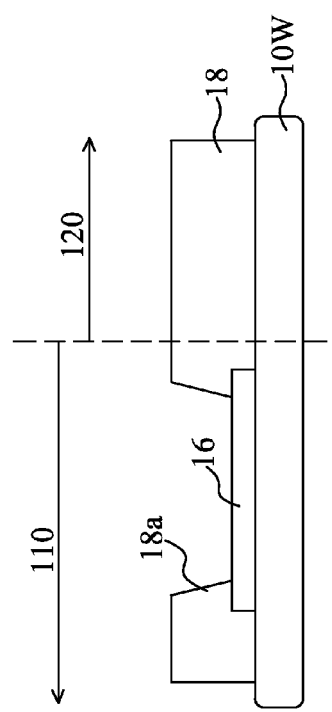

Referring to FIG. 3A, metal pad 16 and passivation later 18 are formed on a wafer-level form substrate 10W that includes a plurality of chip regions. In an embodiment, each chip region includes the first region 110 and the second region 120. The metal pad 16 is formed over the first region 110. The passivation layer 18 is formed on the substrate 10W to cover portions of the metal pad 16. In some embodiments, the formation of the passivation layer 18 includes successfully forming at least one dielectric layer and at least one polymer layer over the substrate 10W and then forming an opening 18a in the stack of the passivation layer 18 such that a portion of the metal pad 16 is exposed. In some embodiments, the passivation layer 18 includes a dielectric layer formed of undoped silicate glass (USG), silicon nitride, silicon oxide, silicon oxynitride or a non-porous material by any suitable method, such as CVD, PVD, or the like. In some embodiments, the passivation layer 18 includes a polymer layer formed of epoxy, polyimide, benzocyclobutene (BCB), polybenzoxazole (PBO), and the like, although other relatively soft, often organic, dielectric materials can also be used.

Figure 3B:
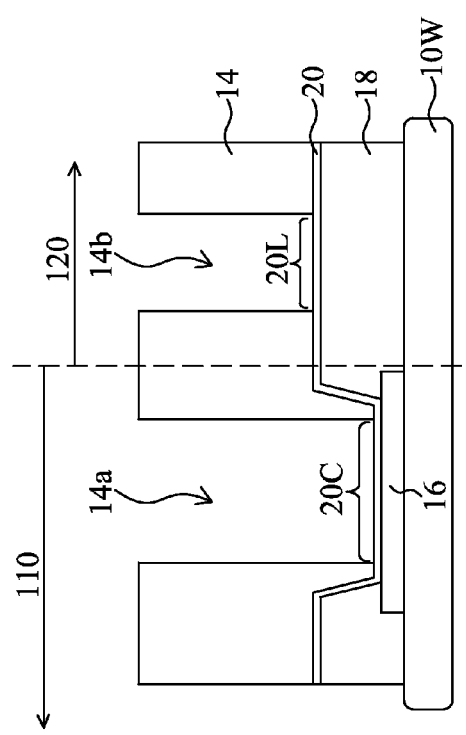

Referring to FIG. 3B, an under-bump metallization (UBM) layer 20 is formed on the resulted structure shown in FIG. 3A. The UBM layer 20 covers the passivation layer 18 and the exposed portion of the metal pad 16. In at least one embodiment, the UBM layer 20 includes a diffusion barrier layer (not shown), which is formed of titanium, tantalum, titanium nitride, tantalum nitride, or the like. In some embodiments, the UBM layer 20 further includes a seed layer (not shown) formed on the diffusion barrier layer. The seed layer may be formed of copper, copper alloys that include silver, chromium, nickel, tin, gold, and combinations thereof. Next, a mask layer 14 is formed on the UBM layer 20, and then the mask layer 14 is patterned to form openings 14a and 14b exposing connection portions 20C and landing portions 20L of the UBM layer 20 respectively. In some embodiments, the connection portion 20C is over the metal pad 16 within the first region 110, and the landing portion 20L is over the passivation layer 18 within the second region 120. The mask layer 14 may be a photoresist layer patterned by photolithography process.

Figure 3C:
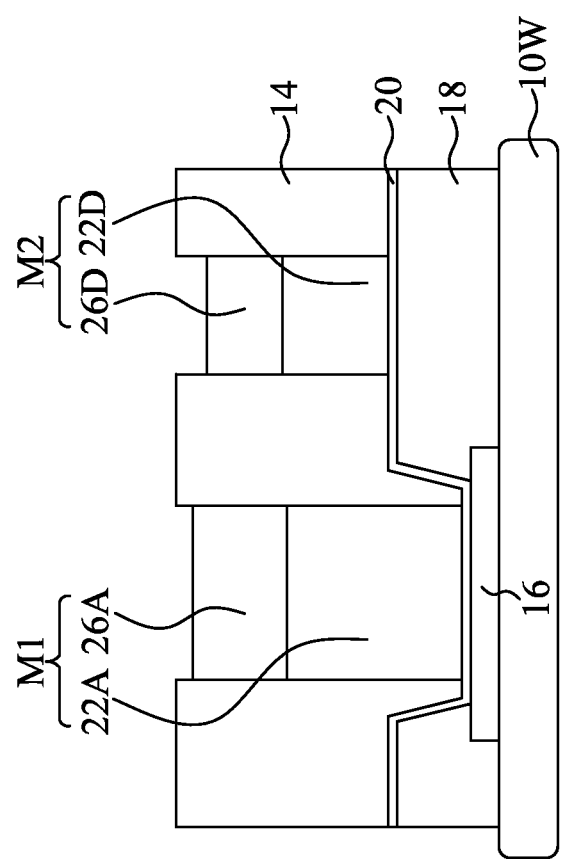

Referring to FIG. 3C, a first metal stack M1 is formed in the opening 14a to electrically connect the connection portion 20C of the UBM layer 20, and a second metal stack M2 is formed in the opening 14b to electrically connect the landing portion 20L of the UBM layer 20 as well.

In an embodiment, the first metal stack M1 includes a first metal pillar 22A and a first solder capping layer 26A. In at least one embodiment, the first metal pillar 22A is intended to include a layer including substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, cobalt or zirconium. In at least one exemplary embodiment, the first metal pillar 22A has a thickness of less than about 20 µm. In another exemplary embodiment, the thickness of the first metal pillar 22A is about 1 to about 20 µm, although the thickness may be greater or smaller. In accordance with some embodiments, the first metal pillar 22A has a lateral dimension which is substantially equal to $W_1$. The first solder capping layer 26A is formed over the first metal pillar 22A. In some embodiments, the first solder capping layer 26A is made of a lead-free solder material, such as Sn, SnAg, Sn—Pb, SnAgCu (with Cu weight percentage less than or equal to about 0.5%), SnAgZn, SnZn, SnBi—In, Sn—In, Sn—Au, SnPb, SnCu, SnZnIn, SnAgSb, and other similarly appropriate material by plating methods. In at least one embodiment, the first solder capping layer 26A is formed with a controlled volume. In an embodiment, the first solder capping layer 26A is formed of a thickness less than about 10 µm. In another embodiment, the thickness is less than or equal to about 7 µm. In at least another embodiment, the thickness is controlled at a range between about 2 µm and about 7 µm.

Similarly, the second metal stack M2 includes a second metal pillar 22D and a second solder capping layer 26D. In at least one embodiment, the second metal pillar 22D includes a layer including substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In an exemplary embodiment, the second metal pillar 22D has a thickness less than or equal to the thickness of the first metal pillar 22A. In accordance with some embodiments, the second metal pillar 22D has a lateral dimension which is substantially equal to $W_2$. The second solder capping layer 26D is formed over second metal pillar 22D. In some embodiments, the second solder capping layer 26D is made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, and other similarly appropriate material by plating methods. In an embodiment, the thickness of the second solder capping layer 26D is similar to the first solder capping layer 26A.

Referring to FIG. 3D, the mask layer 14 is removed, and the exposed portions of the UBM layer 20 are etched using the metal stacks M1 and M2 as hard masks. As a result, the remaining portion of the UBM layer 20 underlying the first metal pillar 22A is referred to as a first UBM layer 20A, and the remaining portion of the UBM layer 20 underlying the second metal pillar 22D is referred to as a second UBM layer 20D. Accordingly, the stack including the first UBM layer 20A, the first metal pillar 22A, and the first solder capping layer 26A is referred to as the first bump structure 28A shown in FIG. 2. The stack including the second UBM layer 20D, the second metal pillar 22D and the second solder capping layer 26D is referred to as the second bump structure 28D shown in FIG. 2.

Figure 3E:
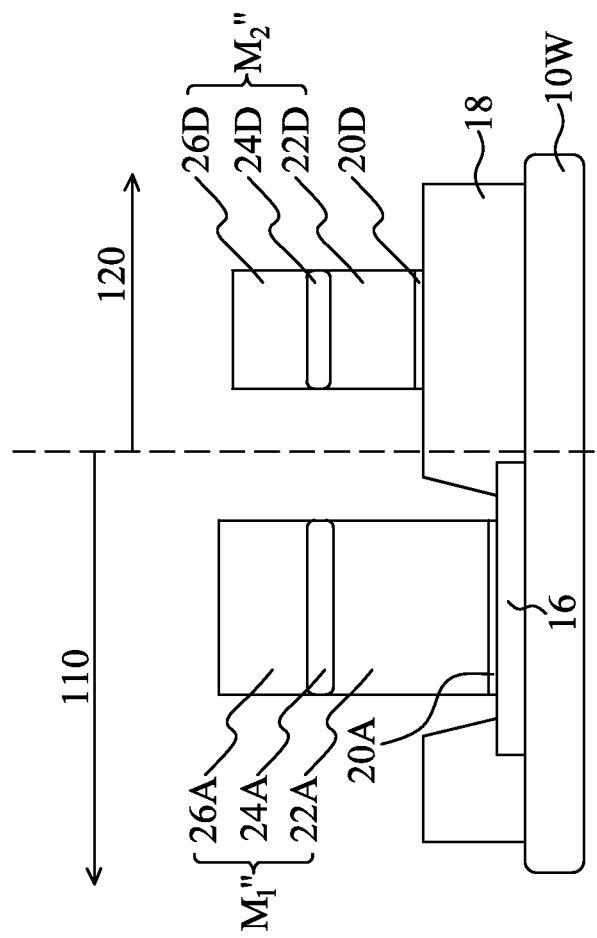

In some embodiments, a metal capping layer can be formed between the metal pillar and the solder capping layer, resulting in a three-layer metal stack. Referring to FIG. 3E, a first metal capping layer 24A is formed between the first metal pillar 22A and the first solder capping layer 26A, and a second metal capping layer 24D is formed between the second metal pillar 22D and the second solder capping layer 26D, forming metal stacks M1" and M2". The metal capping layer 24A or 24D can act as a barrier layer to prevent copper in the metal pillar 22A or 22D from diffusing into a bonding material, such as solder alloy, that is used to connect first substrate 10 to external features. The prevention of copper diffusion increases the reliability and bonding strength of the electronics package. In some embodiments, the metal capping layer 24A and/or 24D is a metallization layer which may include nickel, tin, tin-lead (SnPb), gold (Au), silver (Ag), palladium (Pd), Indium (In), platinum (Pt), nickel-palladium-gold (NiPdAu), nickel-gold (NiAu), other similar materials, or alloys. In an embodiment, the metal capping layer 24A or 24D has a thickness of less than about 5 µm. In other embodiments, the thickness is between about 0.5 µm to about 3 µm.

Next, the wafer-form substrate 10W including a number of chip regions are sawed and separated from each other to form individual chips 100 as shown in FIG. 2 in accordance with some embodiments. Then the chip 100 can be bonded to another substrate to form a package structure.

Figure 4:
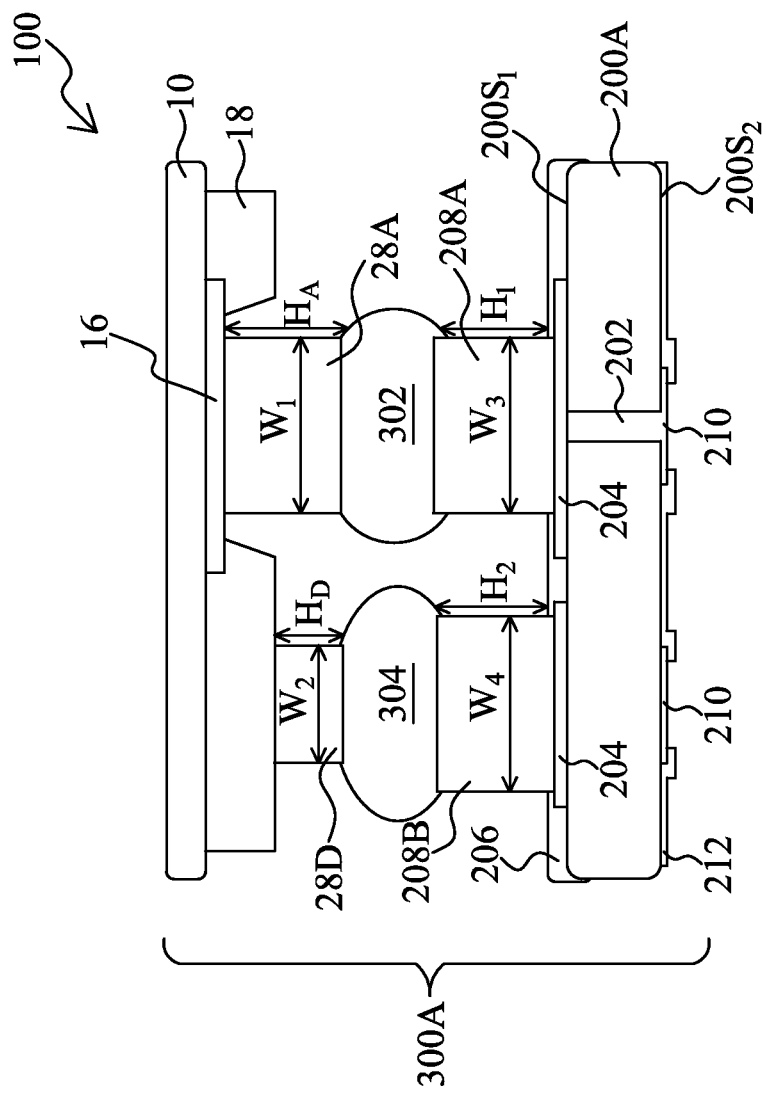
FIGS. 4 through 9 are cross-sectional views of bump structures in package structures accordance with some embodiments.

FIG. 4 depicts in a cross-sectional view of a package structure 300A with the chip 100 bonded on a second substrate 200A in accordance with some embodiments.

The second substrate 200A may be a semiconductor wafer, a portion of a semiconductor wafer, a semiconductor chip, a package substrate, or a circuit board. In some embodiments, the second substrate 200A includes silicon, gallium arsenide, silicon on insulator, glass, ceramic, plastic, organic materials, tape film, or other supporting materials. In some embodiments, the second substrate 200A also includes passive devices such as resistors, capacitors, inductors and the like, or active devices such as transistors. In some embodiments, through vias 202 are formed in the second substrate 200A as shown in FIG. 4. The through vias 202 can be formed of copper, copper alloy or other conductive materials according to some embodiments. In an embodiment, the second substrate 200A functions as an interposer for interconnecting at least one integrated circuit chip to another chip, wafer or substrate. In some embodiments, on a first side $200S_1$ of the second substrate 200A, a plurality of first contact pads 204 are formed, a first dielectric layer 206 is formed to cover portions of the first contact pads 204, and a plurality of connectors 208A and 208B are formed or landed on the exposed portions of the first contact pads 204 respectively. The connectors 208A and 208B can be formed of metal stacks with the same materials and a uniform lateral dimension according to some embodiments. In an embodiment, the connector 208A or 208B includes a metal pillar formed of copper or copper alloy. In some embodiments, the connector 208A or 208B also includes at least one metal capping layer formed of nickel, gold, or solder on the metal pillar. In some embodiments, on a second side $200S_2$ opposite to the first side $200S_1$ of the second substrate 200, a plurality of second contact pads 210 are formed, and a second dielectric layer 212 is formed to cover portions of the second contact pads 210. A plurality of connectors (not shown), such as solder balls may be placed on the exposed portions of the second contact pads 210 respectively for making a connection between the second substrate 200A and an underlying substrate (not shown). In some embodiments, the first connector 208A can be electrically connected to the second contact pads 210 by the through via 202. The first connector 208A has a third lateral dimension $W_3$ (also referring to diameter or width of the first connector), and the second connector 208B has a fourth lateral dimension $W_4$ (also referring to diameter or width of the second connector). In some embodiments, $W_3$ is between about 20 μm and about 30 μm, and $W_4$ is between about 20 μm and about 30 μm. In addition, the first connector 208A has a bump height $H_1$, and the second connector 208D has a bump height $H_2$. In an embodiment, $W_3$ is substantially equal to $W_4$, and $H_1$ is substantially equal to $H_2$.

The package structure 300A shows the chip 100 bonded to the second substrate 200 by connecting the bumps structures 28A and 28D on the first substrate 10 to the connectors 208A and 208B on the second substrate 200. In an embodiment, the first bump structure 28A is physically coupled to the first connector 208A, and the second bump structure 28D is physically coupled to the second connector 208B. For example, by solder reflowing process, a first solder joint region 302 is formed between the first bump structure 28A and the first connector 208A, and a second solder joint region 304 is formed between the second bump structure 28D and the second connector 208B. The thickness of the first solder joint region 302 may be varied depending on the volume of the first solder capping layer 26A and the volume of solder material on the first connector 208A, and the thickness of the second solder joint region 304 may be varied depending on the volume of the second solder capping layer 26D and the volume of solder material on the second connector 208B. In some embodiments, the lateral dimensions $W_1$, $W_2$, $W_3$ and $W_4$ of the bump structures 28A and 28D and the connectors 208A and 208B satisfy the following formulas: $W_1 \geq W_3 > W_2$, or $W_1 \geq W_4 > W_2$.

The distance between the first substrate 10 and the second substrate 200, is called the "standoff". In some embodiments, an underfill material is applied to fill the space between the first substrate 10 and the second substrate 200A for preventing cracks in the solder joint regions. By controlling the lateral dimensions $W_1$, $W_2$, $W_3$ and $W_4$ of the bump structures 28A and 28D and the connectors 208A and 208B, variation of standoffs between the chip 100A and the substrate 200A can be minimized, such that the standoffs become more uniform and the underfill formation process is controllable and repeatable.

The correlation between the lateral dimensions $W_1$, $W_2$, $W_3$ and $W_4$ can be modified to further minimize variation of standoffs. FIGS. 5-9 are cross-sectional views of package structures with the semiconductor chip bonded to the second substrate in accordance with some embodiments. Unless specified otherwise, the reference numerals in these embodiments represent like elements in the embodiments illustrated in FIGS. 1-4.

Figure 5:
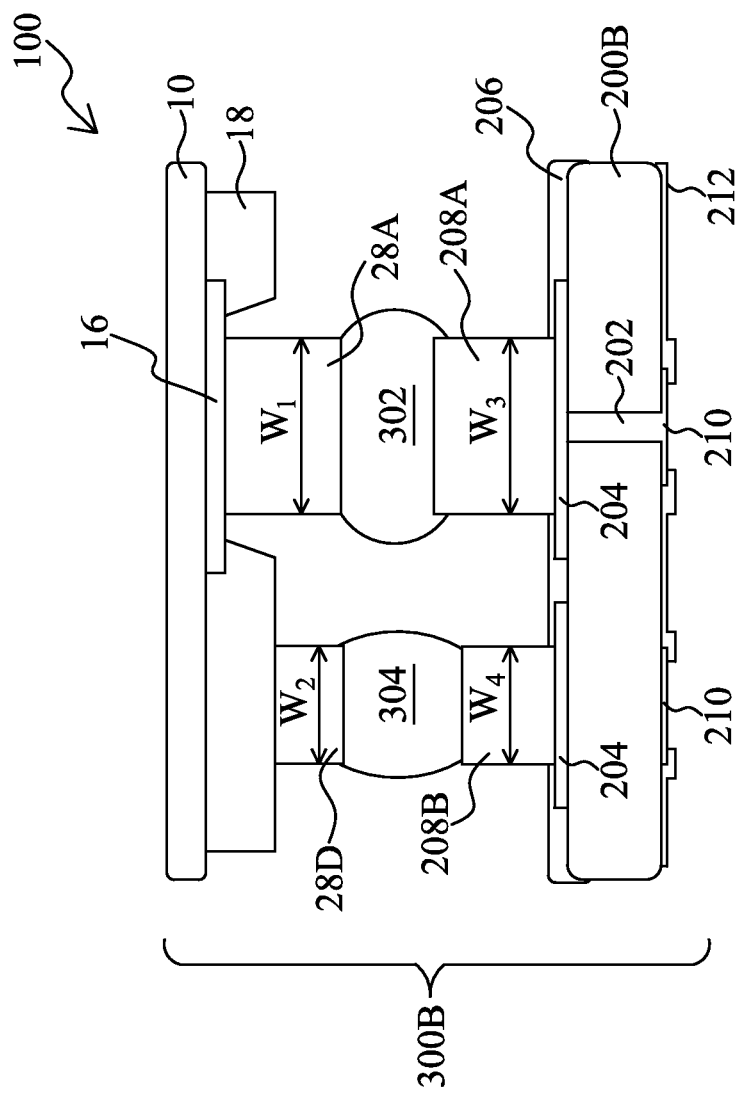

FIG. 5 is a cross-sectional view of a package structure 300B with the semiconductor chip 100 bonded to a second substrate 200B in accordance with some embodiments. On the second substrate 200B, the lateral dimensions and heights of the connectors 208A and 208B are modified to satisfy the formula: $W_3 > W_4$ and $H_1 \geq H_2$. In the package structure 300B, the lateral dimensions $W_1$, $W_2$, $W_3$ and $W_4$ of the bump structures 28A and 28D and the connectors 208A and 208B satisfy the following formula: $W_1 \geq W_3 > W_2$, $W_3 > W_4$, and $W_2 = W_4$.

Figure 6:
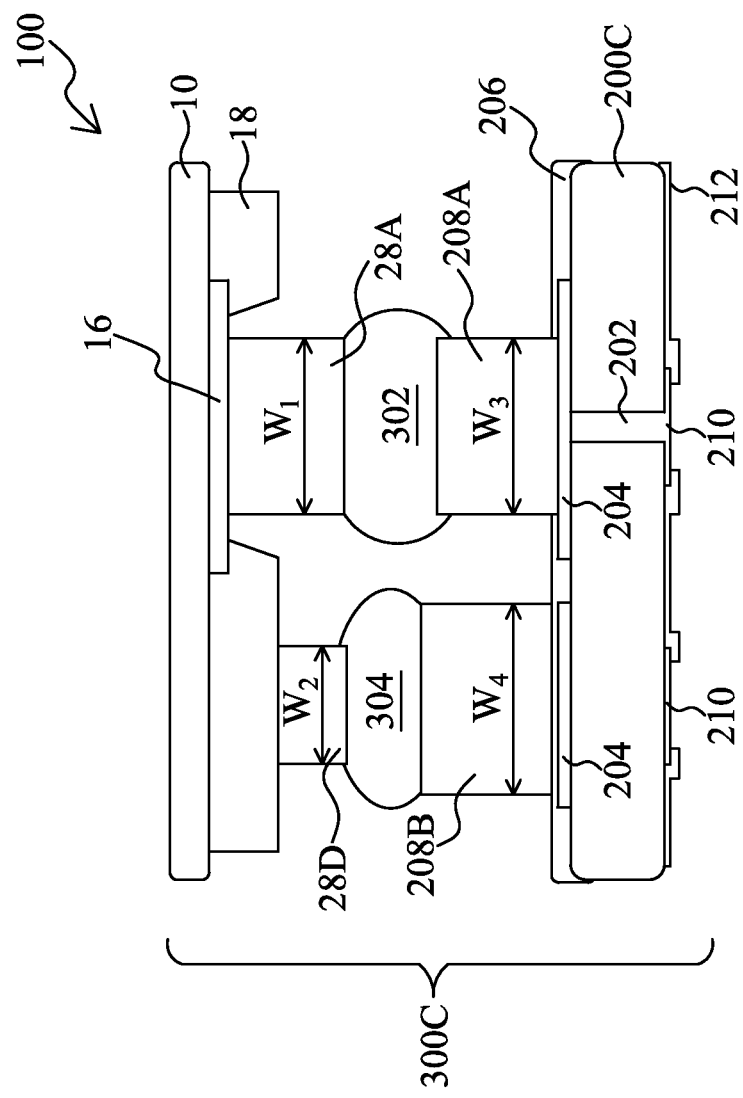

FIG. 6 is a cross-sectional view of a package structure 300C with the semiconductor chip 100 bonded to another second substrate 200C in accordance with some embodiments. On the second substrate 200C, the lateral dimensions and heights of the connectors 208A and 208B are modified to satisfy the formula: $W_4 > W_3$ and $H_2 \geq H_1$. In the package structure 300C, the lateral dimensions $W_1$, $W_2$, $W_3$ and $W_4$ of the bump structures 28A and 28D and the connectors 208A and 208B satisfy the following formula: $W_4 \geq W_1 > W_2$ and $W_1 \geq W_3 > W_2$.

Figure 7:
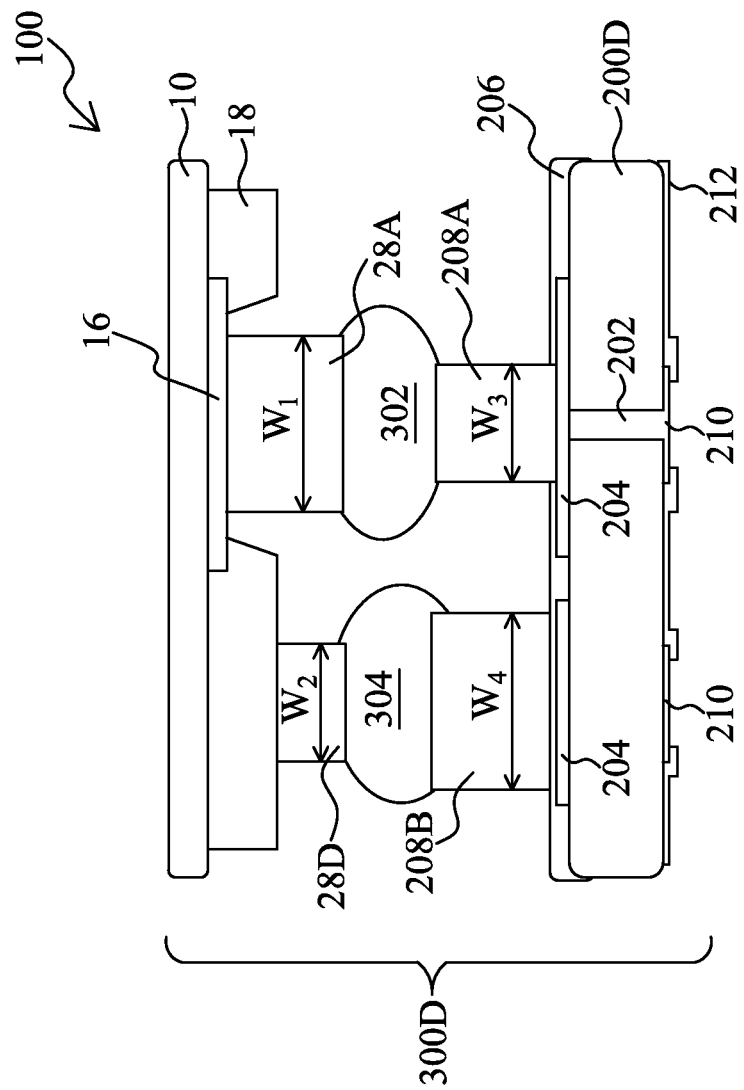

FIG. 7 is a cross-sectional view of a package structure 300D with the semiconductor chip 100 bonded to another second substrate 200D in accordance with some embodiments. In the package structure 300D, the lateral dimensions $W_1$, $W_2$, $W_3$ and $W_4$ of the bump structures 28A and 28D and the connectors 208A and 208B are modified to satisfy the following formula: $W_1 > W_3$, and $W_1 = W_4$, and $W_3 = W_2$.

Figure 8:
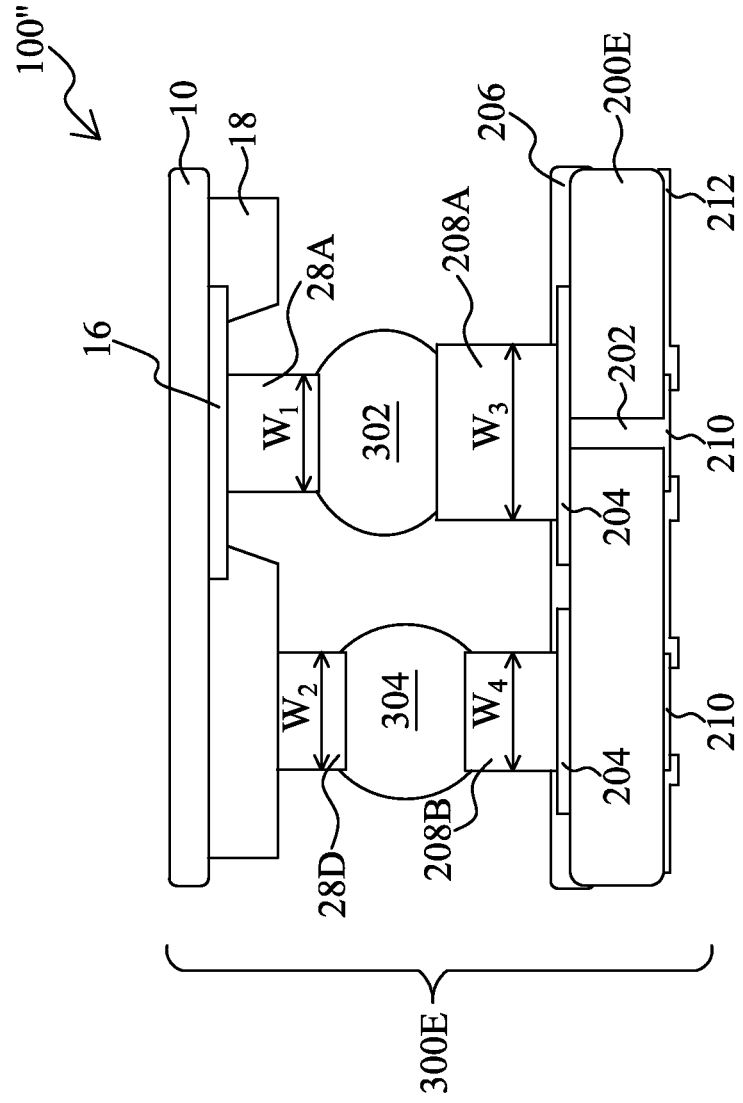

FIG. 8 is a cross-sectional view of a package structure 300E with the semiconductor chip 100" bonded to another second substrate 200E in accordance with some embodiments. In the package structure 300E, the lateral dimensions $W_1$, $W_2$, $W_3$ and $W_4$ of the bump structures 28A and 28D and the connectors 208A and 208B are modified to satisfy the following formula: $W_3 > W_4$, and $W_4 = W_1 = W_2$.

Figure 9:
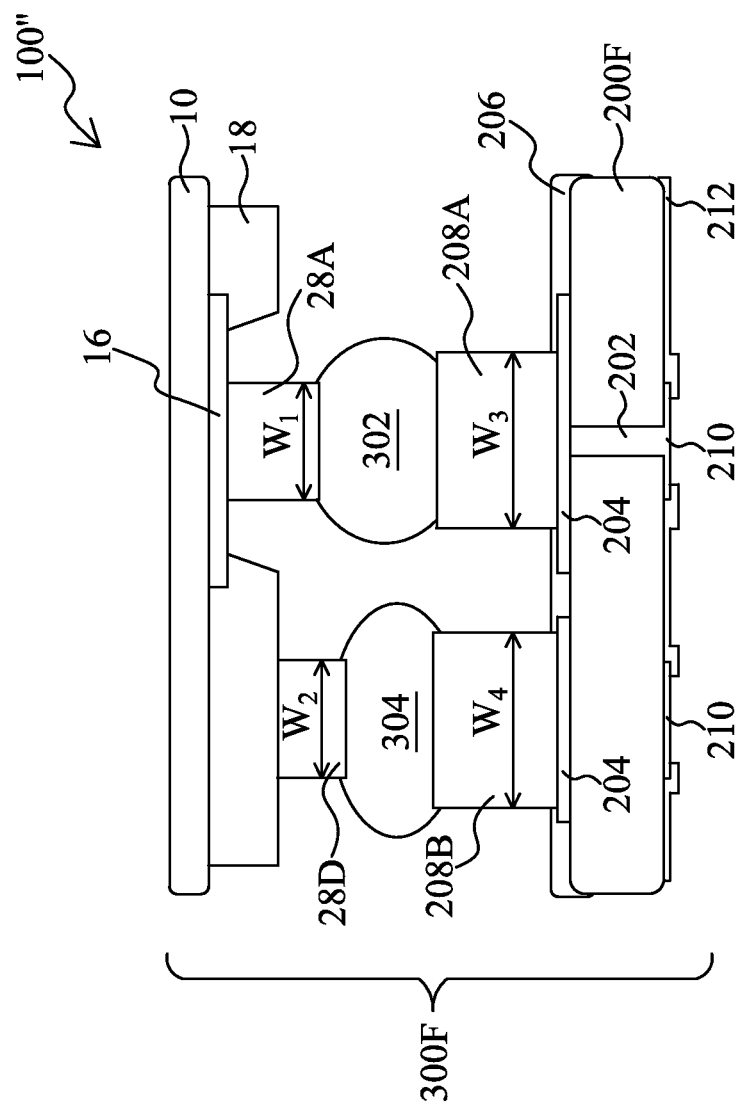

FIG. 9 is a cross-sectional view of a package structure 300F with the semiconductor chip 100" bonded to another second substrate 200F in accordance with some embodiments. In the package structure 300F, the lateral dimensions $W_1$, $W_2$, $W_3$ and $W_4$ of the bump structures 28A and 28D and the connectors 208A and 208B are modified to satisfy the following formula: $W_3 > W_1$, $W_4 > W_1$, $W_3 = W_4$, and $W_1 = W_2$.

According to some embodiments, a package structure includes a first substrate bonded to a second substrate. The first substrate has a first region and a second region and includes a metal pad overlying the first substrate in the first region, a first metal pillar overlying the metal pad, a passivation layer overlying the first substrate in the second region, and a second metal pillar overlying the passivation layer in the second region. The second substrate includes a first connector and a second connector. The first substrate is bonded to the second substrate, in which a first solder joint region is formed between the first metal pillar and the first connector, and a second solder joint region is formed between the second metal pillar and the second connector. The lateral dimension of the first metal pillar is greater than the lateral dimension of the second metal pillar.

According to some embodiments, a package structure includes a first substrate bonded to a second substrate. The first substrate includes a metal pad overlying a first region of the first substrate, an active bump structure overlying the metal pad and including a first metal pillar of a first lateral dimension ($W_1$), a passivation layer overlying a second region of the first substrate, and a dummy bump structure overlying the passivation layer in the second region and including a second metal pillar of a second lateral dimension ($W_2$). The second substrate includes a first connector of a third lateral dimension ($W_3$) and a second connector of a third lateral dimension ($W_4$). The first metal pillar is solder jointed to the first connector, the second metal pillar is solder jointed to the second connector; and $W_1$ is greater than $W_2$.

According to some embodiments, a package structure includes a first substrate bonded to a second substrate. The first substrate has a first region and a second region and includes a metal pad overlying the first substrate in the first region, a first metal pillar having a first lateral dimension ($W_1$) overlying and electrically connected to the metal pad, a passivation layer overlying the first substrate in the second region, and a second metal pillar having a second lateral dimension ($W_2$) overlying the passivation layer in the second region. The second substrate has a first side and a second side opposite to the first side and including a first connector having a third dimension ($W_3$) and a second connector having a fourth lateral dimension ($W_4$) on the first side. The first substrate is bonded to the first side of the second substrate, in which a first solder joint region is formed between the first metal pillar and the first connector, and a second solder joint region is formed between the second metal pillar and the second connector. The lateral dimensions $W_1$, $W_2$, $W_3$ and $W_4$ satisfy the formula: $W_1=W_2$, and $W_3>W_1$.

According to some embodiments, a method of forming bump structures on a first region and a second region of a semiconductor substrate, including: forming a metal pad overlying the first region of semiconductor substrate; forming a passivation layer overlying the metal pad and the semiconductor substrate; patterning the passivation layer to expose a portion of the metal pad; forming an under-bump metallization (UBM) layer on the passivation layer and the exposed portion of the metal pad; forming a first metal pillar on the UBM layer over the exposed portion of the metal pad; and forming a second metal pillar on the UBM layer over the passivation layer within the second region. The lateral dimension of the first metal pillar is greater than the lateral dimension of the second metal pillar.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A package structure, comprising a first device bonded to a second device, wherein
the first device comprises:
a metal pad overlying a first region of the first device;
an active bump structure overlying the metal pad and comprising a first metal pillar of a first lateral dimension ($W_1$);
a passivation layer overlying a second region of the first device, wherein the active bump structure extends above the passivation layer and further wherein the first metal pillar has a topmost surface that is at a first height above a topmost surface of the passivation layer, and
a dummy bump structure directly on the passivation layer in the second region and comprising a second metal pillar of a second lateral dimension ($W_2$), wherein the second metal pillar has a topmost surface that is at the first height above the topmost surface of the passivation layer, wherein the passivation layer electrically and physically isolates the dummy bump structure from any underlying conductors;
the second device comprising a first connector of a third lateral dimension ($W_3$) and a second connector of a fourth lateral dimension ($W_4$), wherein $W_3$ is greater than or equal to $W_4$ and wherein $W_3$ is greater than $W_2$; and
wherein the first metal pillar is solder jointed to the first connector, the second metal pillar is solder jointed to the second connector; and $W_1$ is equal to $W_2$.

2. The package structure of claim 1, wherein $W_3$ is greater than $W_4$.

3. The package structure of claim 2, wherein $W_2$ is equal to $W_4$.

4. The package structure of claim 1, wherein $W_1$ is equal to $W_4$.

5. The package structure of claim 1, wherein the first device comprises a semiconductor substrate, and the second metal pillar comprises a copper pillar.

6. The package structure of claim 1, wherein the first connector comprises a copper pillar, and the second connector comprises a copper pillar.

7. The package structure of claim 1, further comprising a conductive via passing through the second device and electrically connected to the first connector.

8. A package structure, comprising:
a first device having a first region and a second region and comprising a metal pad overlying the first device in the first region, a first metal pillar having a first lateral dimension ($W_1$) overlying and electrically connected to the metal pad, a passivation layer having a top surface and overlying the first device in the second region, and a second metal pillar having a second lateral dimension ($W_2$), the second metal pillar being directly on the passivation layer in the second region and electrically and physically isolated from underlying features by the passivation layer, wherein the first metal pillar and the second metal pillar extend above the top surface of the passivation layer and have respective topmost surfaces that are substantially coplanar with one another; and
a second device having a first side and a second side opposite to the first side and comprising a first connector having a third dimension ($W_3$) and a second connector having a fourth lateral dimension ($W_4$) on the first side, wherein the first device is bonded to the first side of the second device, in which a first solder joint region is formed between the first metal pillar and the first connector, and a second solder joint region is formed between the second metal pillar and the second connector; and
wherein the lateral dimensions $W_1$, $W_2$, $W_3$ and $W_4$ satisfy the formula: $W_1=W_2$, and $W_3>W_1$.

9. The package structure of claim 8, wherein the lateral dimensions $W_1$, $W_2$, $W_3$ and $W_4$ satisfies the formula: $W_3>W_4>W_1$.

10. The package structure of claim 8, wherein the lateral dimensions $W_1$, $W_2$, $W_3$ and $W_4$ satisfies the formula: $W_3=W_4$.

11. The package structure of claim 8, further comprising a conductive via passing through a substrate of the second device and electrically connected to the first connector.

12. A method of forming bump structures on a first region and a second region of a semiconductor substrate, comprising:
- forming a metal pad overlying the first region of semiconductor substrate;
- forming a passivation layer overlying the metal pad and the semiconductor substrate in the first region and the second region;
- patterning the passivation layer to expose a portion of the metal pad;
- forming an under-bump metallization (UBM) layer on the passivation layer and the exposed portion of the metal pad;
- forming a first metal pillar on the UBM layer over the exposed portion of the metal pad and extending through the passivation layer, the first metal pillar having a lateral dimension of $W_1$;
- forming a second metal pillar on the UBM layer directly on the passivation layer in the second region;
- solder joining the first metal pillar to a third metal pillar, the third metal pillar having a lateral dimension of $W_3$; and
- solder joining the second metal pillar to a fourth metal pillar, the fourth metal pillar having a lateral dimension of $W_4$;
- wherein the lateral dimension of the first, second, third and fourth metal pillars satisfy the formula: $W_1 = W_2$, and $W_3 > W_1$.

13. The method of claim 12, further comprising:
- forming a first solder capping layer overlying the first metal pillar; and
- forming a second solder capping layer overlying the second metal pillar.

* * * * *